United States Patent
Kwon

(10) Patent No.: US 8,625,017 B2
(45) Date of Patent: *Jan. 7, 2014

(54) CMOS IMAGE SENSOR WITH SHARED SENSING MODE

(75) Inventor: Oh-Bong Kwon, Cheongju-Si (KR)

(73) Assignee: Intellectual Ventures II LLC, Wilmington, DE (US)

( * ) Notice: Subject to any disclaimer, the term of this patent is extended or adjusted under 35 U.S.C. 154(b) by 9 days.

This patent is subject to a terminal disclaimer.

(21) Appl. No.: 13/410,875

(22) Filed: Mar. 2, 2012

(65) Prior Publication Data

US 2012/0161214 A1    Jun. 28, 2012

Related U.S. Application Data

(63) Continuation of application No. 11/345,207, filed on Jan. 31, 2006, now Pat. No. 8,149,312.

(30) Foreign Application Priority Data

Jan. 31, 2005 (KR) .................. 10-2005-0008654

(51) Int. Cl.
*H04N 3/14* (2006.01)
*H04N 5/335* (2011.01)

(52) U.S. Cl.
USPC ........... 348/308; 348/300; 348/302; 348/294; 257/445; 257/462

(58) Field of Classification Search
USPC .......... 348/300, 302, 308, 294, 241; 257/292, 257/462, 445, 359; 250/208.1
See application file for complete search history.

(56) References Cited

U.S. PATENT DOCUMENTS

| | | |
|---|---|---|
| 6,452,153 B1 | 9/2002 | Lauxtermann et al. |
| 6,633,334 B1 | 10/2003 | Sakurai et al. |
| 2005/0110884 A1 | 5/2005 | Altice, Jr. et al. |
| 2006/0274176 A1 | 12/2006 | Guidash |

FOREIGN PATENT DOCUMENTS

| | | |
|---|---|---|
| JP | 90-46596 | 2/1997 |
| JP | 2003-009003 | 1/2003 |
| JP | 2003-134396 | 5/2003 |
| JP | 2006-041866 | 2/2006 |
| KR | 10-1998-016536 | 6/1998 |
| KR | 10-1999-0084630 | 12/1999 |
| KR | 10-2000-0003346 A | 1/2000 |
| KR | 10-2002-0014315 | 2/2002 |

OTHER PUBLICATIONS

Notice of Allowance issued in Korean Application No. 10-2006-0132988, mailed Nov. 12, 2007.
English Translation of Notice of Allowance issued in Korean Application No. 10-2006-0132988, mailed Nov. 12, 2007.

(Continued)

*Primary Examiner* — Antoinette Spinks
(74) *Attorney, Agent, or Firm* — McAndrews, Held & Malloy, Ltd.

(57) ABSTRACT

A CMOS image sensor has a pixel array provided with a plurality of unit pixels arranged in a matrix shape of rows and columns. Each of the unit pixel includes a photocharge generation means for generating photocharges by absorbing an external light; and a sensing node for receiving the photocharges transferred from the photocharge generation means, wherein the sensing node of the unit pixel in a previous scan line is shared with a sensing node of a unit pixel in a current scan line in response to a line select signal of the current line.

17 Claims, 4 Drawing Sheets

(56) References Cited

OTHER PUBLICATIONS

English Translation abstract of KR 10-1999-084630, published Dec. 6, 1999.
English Translation abstract of KR 10-1998-016536, published Jun. 5, 1998.
English Translation abstract of KR 10-2002-0014315, published Feb. 25, 2002.
Japanese Office Action for counterpart Japanese Patent Application No. 2006-001285, dated Aug. 10, 2010 (and English translation).
Computer-generated English translation of JP 2006-041866.
Japanese Office Action for counterpart Japanese Patent Application No. 2006-001285, dated Nov. 24, 2010 (and English translation).
Computer-generated English translation of JP 2003-009003.
Computer-generated English translation of JP 2003-134396.
Computer-generated English translation of JP 90-46596.

CMOS IMAGE SENSOR WITH SHARED SENSING MODE

CROSS REFERENCE TO RELATED APPLICATIONS

The present application is a continuation of U.S. patent application Ser. No. 11/345,207, filed Jan. 31, 2006, which is hereby expressly incorporated herein by reference as though set forth in full.

FIELD OF THE INVENTION

The present invention relates to a complementary metal oxide semiconductor (hereinafter, referred to as a CMOS) image sensor; and, more particularly, to a pixel array of a CMOS image sensor for increasing storage capacitance of a sensing node.

DESCRIPTION OF RELATED ARTS

In general, an image sensor is an apparatus for capturing an image using a characteristic of a semiconductor which is sensitive to a light. Every portion of each object existing in nature has different brightness and wavelength so that it shows different electrical values at respective pixels that sense an incident light corresponding to each portion of the object. In this manner, the image sensor serves a role of converting these electrical values into predetermined levels of signals which can be processed through a circuitry.

FIG. 1 is a block diagram setting forth a conventional CMOS image sensor.

Referring to FIG. 1, the conventional CMOS image sensor includes an interface unit 10, a pixel array 20, an analog-digital converter 30 and a buffer 40. Herein, the interface unit 10 controls overall operation of the CMOS image sensor, and acts as an interface with respect to an external system. The pixel array 20 is configured with an N number of pixel columns and an M number of pixel rows to have N×M number of pixels so that the pixel array 20 senses information with regard to an image inputted from an exterior, wherein each pixel is constructed such that its photosensitivity may be maximized. The analog-digital converter 30 converts an analog voltage sensed at each pixel of the image sensor into a digital voltage to be processed at a digital system. The buffer 40 stores the digitalized image data of the pixel in response to the output of the analog-digital converter 30.

In addition, the analog-digital converter 30 is provided with a digital-analog converter (DAC) 31 and a voltage comparator 32. The DAC 31 generates a reference voltage in ramp type which is linearly decreased with a clock, wherein the reference voltage is used for being compared with a voltage sensed at each pixel. The voltage comparator 32 configured with N number of arrangements compares the sensed voltage, i.e., an analog voltage, outputted from the pixel array 20 with the reference voltage of the DAC 31, and outputs a write enable signal which allows a counter value outputted from the interface unit 10 to be written to the buffer 40 while the reference voltage is higher than the sensed voltage.

If the CMOS image sensor employs a correlated double sampling (CDS) method in order to produce high quality image, each unit pixel 100 and 120 of the pixel array is configured with one photodiode and four transistors, as illustrated in FIG. 2. In detail, the four transistors are configured with a transfer transistor M21 for transferring photocharges generated at the photodiode 101 to a sensing node A, a reset transistor M11 for discharging the photocharges stored at the sensing node A in order to detect a next signal, a drive transistor M31 for acting as a source follower, and a select transistor M41 for switching and addressing.

Herein, in the CDS method, a voltage corresponding to a reset level is obtained by turning on the reset transistor M11 but turning off the transfer transistor M21, and subsequently, the photocharges generated at the photodiode 101 are read to obtain a data voltage level by turning off the reset transistor M11 but turning on the transfer transistor M21. Thereafter, a voltage difference between the reset voltage level and the data voltage level is obtained as a pure image data signal.

FIG. 3 is a control timing diagram illustrating signals controlling each transistor in the unit pixel of FIG. 2. Referring to FIG. 3, an operation of the unit pixel will be set forth for every section in detail herebelow.

1) A Section

In this section, the transfer transistor M21 and the reset transistor M11 are turned on, but the select transistor M41 is turned off. Therefore, the photodiode 101 is in a state of a fully depletion.

2) B Section

In this section, the transfer transistor M21 is turned off so that the photodiode 101 absorbs the light to generate the photocharges. Thus, the generated photocharges are integrated during this section. Meanwhile, the section B maintains till the transfer transistor M21 is turned on again regardless of the states of the reset and select transistors M11 and M41.

3) C Section

In this section, the reset transistor M11 is turned on, and the transfer transistor M21 maintains to be turned off, bur the select transistor M41 is turned on so that a reset voltage level is transferred through the drive transistor M31 and the select transistor M41.

4) D Section

In this section, the reset transistor M11 is turned off so as to settle the reset voltage level generated during the section C.

5) E Section

This is a section for sampling the reset voltage level of the section D.

6) F Section

In this section, the reset transistor M11 and the select transistor M41 maintain to be turned off and on, respectively, and the transfer transistor M21 is turned on so that the photocharges integrated at the photodiode 101 during the section B are transferred to the sensing node A. Thus, a data voltage level is transferred through the drive transistor M31 and the select transistor M41.

7) G Section

In this section, the transfer transistor M21 is turned off so as to settle the data voltage level generated during the section F.

8) H Section

This section is for sampling the data voltage level of the section G.

The reset voltage level and the data voltage level which are sampled at the section E and H respectively, are outputted to the analog-digital converter 30 and then, are converted into a digital data. The difference value between the digitally-converted reset voltage level and the data voltage level becomes an output image data of the CMOS image sensor for the image inputted through the photodiode 101.

Herein, the other unit pixels of the conventional CMOS image sensor operate like that of the unit pixel 100 which has been described above. In case of employing a row-by-row scanning type in the pixel array, the scanning is performed from a first row to a last row in sequence.

Therefore, for example, when obtaining a data from a pixel of an nth row after obtaining a data from a pixel of an n−1th row, photocharges are integrated anew after cleaning up all the pixels corresponding to a first to the n−1th rows.

Meanwhile, as described above, the photodiode constituting each unit pixel should have high capacitance for generating the photocharges and integrating them in order to obtain good image quality. To this end, an attempt for improving fill-factor has been made using a technology of increasing a photodiode area and so forth.

However, the sensing node in the conventional CMOS image sensor, which is implemented as a high concentration impurity diffusion region, does not have capacitance enough to receive increased photocharges in spite of the enhanced fill-factor, which makes it difficult to obtain a desired photosensitivity after all.

SUMMARY OF THE INVENTION

It is, therefore, an object of the present invention to provide a CMOS image sensor of which a capacitance of a sensing node is increased by sharing the sensing node of an adjacent non-selected pixel while a selected pixel operates, in order that the sensing node may receive photocharges generated much more due to an enhanced fill-factor.

In accordance with an aspect of the present invention, there is provided A CMOS image sensor having a pixel array provided with a plurality of unit pixels arranged in a matrix shape of rows and columns, each of the unit pixel including: a photocharge generation means for generating photocharges by absorbing an external light; and a sensing node for receiving the photocharges transferred from the photocharge generation means, wherein the sensing node of the unit pixel in a previous scan line is shared with a sensing node of a unit pixel in a current scan line in response to a line select signal of the current line.

In accordance with another aspect of the present invention, there is provided A CMOS image sensor including: a pixel array in which a plurality of unit pixels are arranged in a matrix shape of rows and columns; and a switching means for interconnecting a sensing node of a selected unit pixel to a sensing node of another neighboring unit pixel in response to a select signal, to increase a storage capacitance of the sensing node of the selected pixel. Herein, the unit pixel includes a photocharge generation means for generating photocharges by absorbing an external light; a sensing node for receiving the photocharges transferred from the photocharge generation means; a transfer means for transferring the photocharges from the photocharge generation means to the sensing node; a rest means for resetting the sensing node; an output means for outputting an electric signal in response to the sensing node; and an addressing means of which one side is connected to the output means for switching and addressing in response to the select signal.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A CMOS image sensor with shared sensing node in accordance with exemplary embodiments of the present invention will be described in detail with reference to the accompanying drawings.

Figure 1:
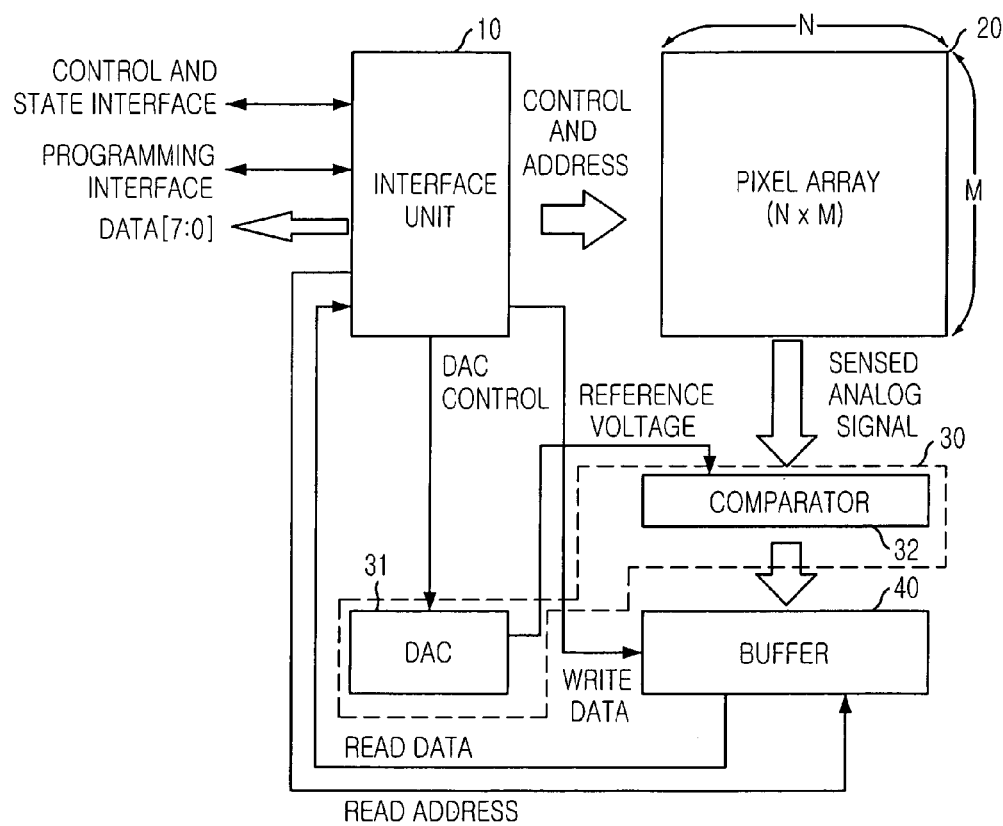
FIG. 1 is a block diagram of a conventional CMOS image sensor.
Figure 2:
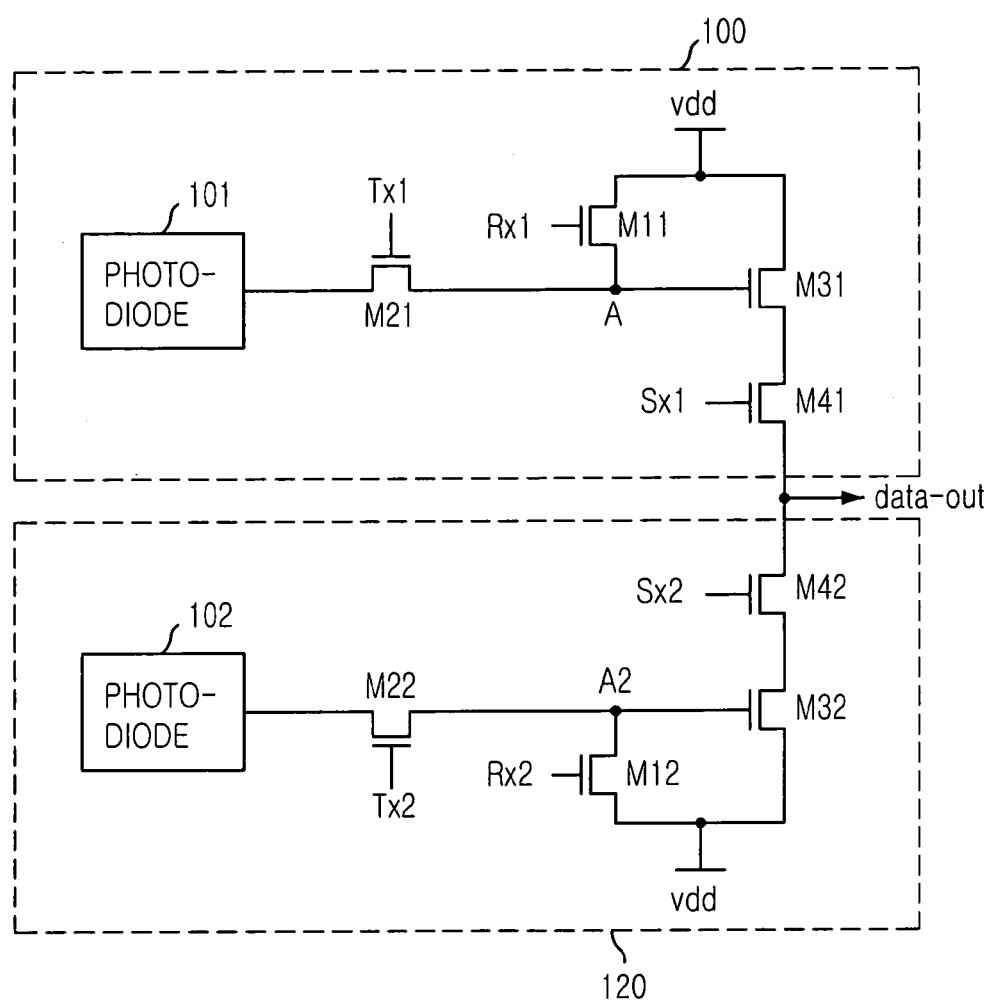
FIG. 2 is a circuit diagram setting forth a pixel array of the conventional CMOS image sensor.
Figure 3:
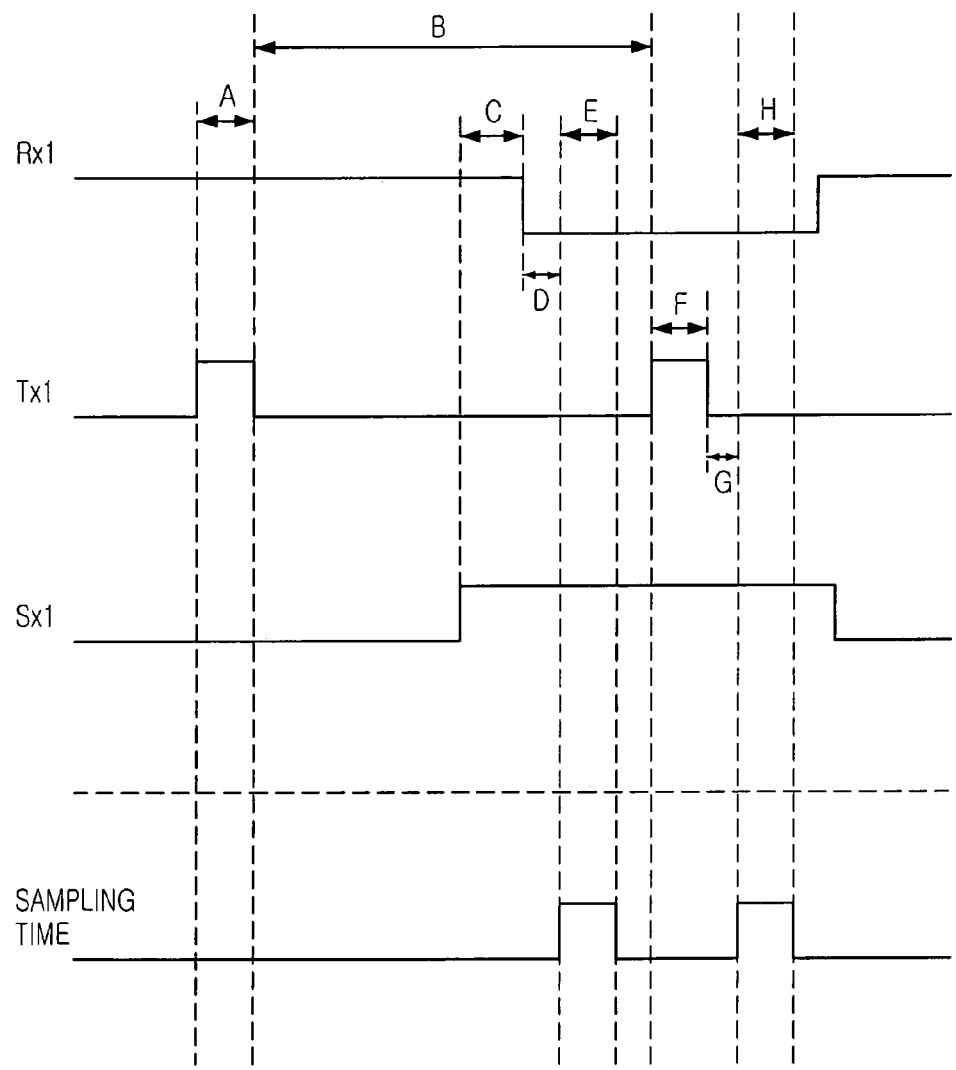
FIG. 3 is a timing diagram setting forth a unit pixel of FIG. 2.
Figure 4:
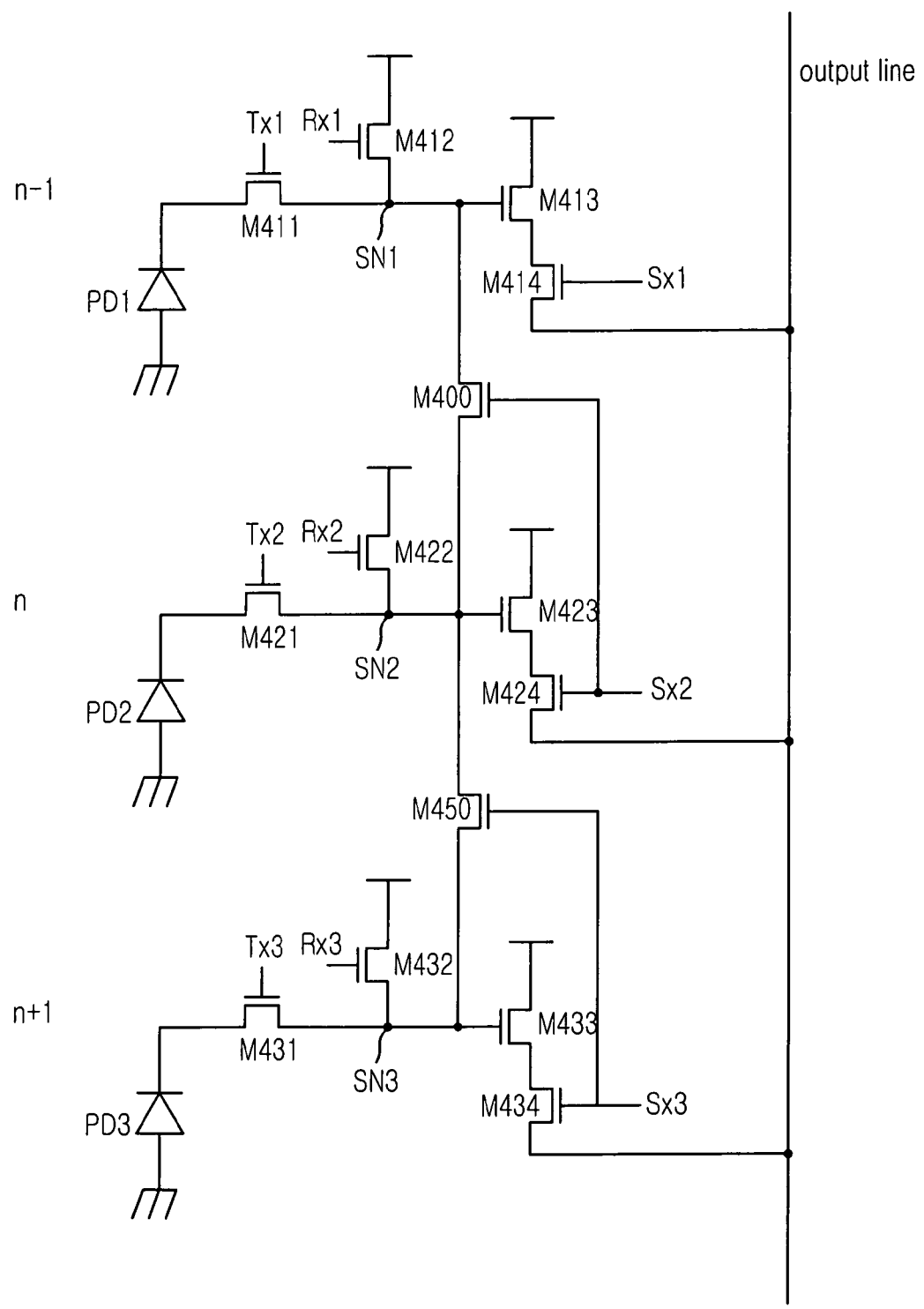
FIG. 4 is a circuit diagram illustrating a pixel array of a CMOS image sensor in accordance with an embodiment of the present invention.

FIG. 4 is a circuit diagram illustrating a pixel array of a CMOS image sensor in accordance with an embodiment of the present invention. In particular, FIG. 4 represents three unit pixels which are successively arranged in the same column among a plurality of unit pixels in the pixel array.

The CMOS image sensor of the present invention is configured with a pixel array in which a plurality of unit pixels are arranged in a column direction and a row direction, like typical constitutions. The CMOS image sensor is driven by a line scanning fashion where a scanning is performed line by line, i.e., row by row or column by column, in sequence. Unlike the prior art, a sensing node SN2 of a pixel in a currently scanning line, e.g., an nth row of FIG. 4, is shared with a sensing node SN1 of a pixel in a lately scanned line, e.g., an n−1th row of FIG. 4, and receives photocharges from a photodiode PD2 of the pixel in the currently scanning line.

FIG. 4 illustrates one embodiment that the line scanning is performed row by row, in which the sensing nodes are shared with a nearest-neighboring pixel arranged in the same column. However, if the line scanning is a column scanning fashion, i.e., scanned column by column, the sensing nodes are shared with a nearest-neighboring pixel arranged in the same row.

The sharing scheme of the sensing nodes is accomplished through a switching device which connects the sensing nodes of the neighboring pixels, wherein the switching device is controlled by a line select signal. To this end, the switching device in the embodiment of FIG. 4 is configured with an NMOS transistor M400 of which a source and a drain are connected between the sensing node SN2 of the selected pixel and the sensing node SN1 of the lately selected pixel, wherein a row select signal SX2 of the currently scanning row is inputted a gate thereof.

Referring to FIG. 4, the CMOS image sensor in accordance with the present invention will be set forth more fully in detail herebelow.

In FIG. 4, it is shown only three unit pixels for the sake of illustrative purpose, which are arranged at intersections of a predetermined one column and an n−1th row, an nth row and an n+1th row, respectively.

Considering the constitutions of the unit pixel of the nth row, the unit pixel includes a photocharge generator PD2 for receiving a light from an object to generate photocharges, a sensing node SN2 for receiving the photocharges from the photocharge generator PD2, a transfer unit M421 for transferring the photocharges from the photocharge generator PD2 to the sensing node SN2, a reset unit M422 for resetting the sensing node SN2, an output unit M423 for outputting an electric signal corresponding to the sensing node SN2, and an addressing unit M424 of which one side is connected to the output unit M423 for switching and addressing in response to a row select signal SX2. Herein, the photocharge generator PD2 is configured with a photodiode. The addressing unit M424 is configured with an NMOS transistor of which one side is connected to the output unit M423 and the other side is connected to an output line. The output unit M423 is configured with an NMOS transistor of which one side is connected to a first power terminal VCC and the other is connected to the addressing unit M424. The reset unit M422 is configured with an NMOS transistor of which one side is connected to the first power terminal VCC and the other side is connected to the sensing node SN2. The transfer unit M421 is configured with an NMOS transistor of which one side is connected to the photocharge generator PD2 and the other is connected to the sensing node SN2.

The unit pixels in the n−1th row and the n+1th row are identical in the constitution to the unit pixel of the nth row. Thus, further descriptions for them will be omitted herein.

In addition, as described above, in order to increase the storage capacitance of the sensing node, the CMOS image sensor of the present invention further includes the switching device M400 and M450 for interconnecting the sensing node of the currently selected pixel to the sensing node of the nearest-neighboring pixel which is lately scanned, in response to the row select signal. In detail, the switching device M400 and M500 is configured with an NMOS transistor of which a source and a drain are connected to the sensing node of the currently selected pixel and the sensing node of the nearest-neighboring pixel which is lately scanned, wherein the row select signal is inputted to a gate thereof.

For example, if the unit pixel of the nth row is being scanned now, the sensing node SN1 of the unit pixel in the n−1th row which has been scanned lately and the sensing node SN2 of the unit pixel in the nth row are shared with each other so as to receive the photocharges from the photodiode PD2 of the unit pixel in the nth row.

As stated above, since the CMOS image sensor of the present invention shares the sensing node of the nearest-neighboring unit pixel of a non-selected line when the specific unit pixel of a selected line is operating, it is possible to receive much more photocharges generated due to the enhanced fill-factor. That is, the storage capacitance of the sensing node is increased in virtue of the sharing scheme of the sensing node between nearest-neighboring pixels so that it is possible to implement a high quality CMOS image sensor.

The present application contains subject matter related to the Korean patent application No. KR 2005-08654, filed in the Korean Patent Office on Jan. 31, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor, comprising:
a pixel array in which a plurality of sensing pixels are arranged in a matrix of rows and columns, wherein a sensing pixel in the pixel array includes:
a photodiode operable to produce an electrical signal in response to incident light; and
a sensing node arranged to receive the electrical signal, wherein the sensing node is selectively couplable to a sensing node of a sensing pixel in a previous scan line of the pixel array.

2. The image sensor of claim 1, configured such that a line scanning is performed row-by-row, wherein the previous scan line is a previously-scanned row.

3. The image sensor of claim 2, further configured such that the selectively-coupled sensing nodes are the sensing nodes of nearest-neighboring sensing pixels arranged in the same column.

4. The image sensor of claim 1, configured such that a line scanning is performed column-by-column, wherein the previous scan line is a previously-scanned column.

5. The image sensor of claim 4, further configured such that the selectively-coupled sensing nodes are the sensing nodes of nearest-neighboring sensing pixels arranged in the same row.

6. The image sensor of claim 1, wherein the image sensor is a complementary metal-oxide semiconductor (CMOS) image sensor.

7. An image sensor, comprising:
a pixel array in which a plurality of sensing pixels are arranged in a matrix of rows and columns, wherein each sensing pixel comprises:
a photodiode operable to produce an electrical signal in response to incident light; and
a sensing node arranged to receive the electrical signal; and
a switching device configured to interconnect a first sensing node of a first sensing pixel to a second sensing node of a second sensing pixel in response to a select signal, wherein the first sensing pixel is in a first scan line and the second sensing pixel is in a second scan line.

8. The image sensor of claim 7, wherein the pixel array is configured to be scanned row-by-row, and wherein the first sensing pixel is a nearest-neighboring sensing pixel arranged in the same column as the second sensing pixel.

9. The image sensor of claim 7, wherein the pixel array is configured to be scanned column-by-column, and wherein the first sensing pixel is a nearest-neighboring sensing pixel arranged in the same row as the second sensing pixel.

10. The image sensor of claim 7, wherein the image sensor is a complementary metal-oxide semiconductor (CMOS) image sensor.

11. The image sensor of claim 10, wherein the switching device comprises an NMOS transistor having a source/drain pathway connected between the first sensing node of the first sensing pixel and the second sensing node of the second sensing pixel, and wherein the NMOS transistor is configured to receive the select signal through a gate thereof.

12. The image sensor of claim 10, wherein each sensing pixel further comprises a reset transistor configured to reset the sensing node, and wherein the reset transistor comprises an NMOS transistor having one side connected to a first power terminal and the other side connected to the sensing node.

13. The image sensor of claim 10, wherein each sensing pixel further comprises a transfer transistor configured to transfer the electrical signal from the photodiode to the sensing node, and wherein the transfer transistor comprises an NMOS transistor having one side connected to the photodiode and the other side connected to the sensing node.

14. The image sensor of claim 7, wherein each sensing pixel further comprises:
an output unit configured to output an electrical signal from the sensing node; and
a select transistor having one side connected to the output unit, wherein the select transistor is configured to switch an address in response to the select signal.

15. The image sensor of claim 14, wherein the select transistor comprises an NMOS transistor having one side connected to the output unit and the other side connected to an output terminal.

16. The image sensor of claim 14, wherein the output unit comprises an NMOS transistor having one side connected to a first power terminal and the other side connected to the one side of the select transistor.

17. The image sensor of claim 7, wherein the switching device directly connects the first sensing node and the second sensing node.

* * * * *

UNITED STATES PATENT AND TRADEMARK OFFICE
CERTIFICATE OF CORRECTION

PATENT NO. : 8,625,017 B2  Page 1 of 1
APPLICATION NO. : 13/410875
DATED : January 7, 2014
INVENTOR(S) : Oh-Bong Kwon It is certified that error appears in the above-identified patent and that said Letters Patent is hereby corrected as shown below:

Title page of the patent under item (54) title data delete "Mode" and insert -- Node --

Signed and Sealed this
Fourteenth Day of October, 2014

Michelle K. Lee
*Deputy Director of the United States Patent and Trademark Office*

UNITED STATES PATENT AND TRADEMARK OFFICE
CERTIFICATE OF CORRECTION

Page 1 of 1

PATENT NO. : 8,625,017 B2
APPLICATION NO. : 13/410875
DATED : January 7, 2014
INVENTOR(S) : Oh-Bong Kwon It is certified that error appears in the above-identified patent and that said Letters Patent is hereby corrected as shown below:

Title page of the patent under item (54) and in the specification, Col. 1, line 2, title data delete "Mode" and insert -- Node --

This certificate supersedes the Certificate of Correction issued October 14, 2014.

Signed and Sealed this
Eleventh Day of November, 2014

Michelle K. Lee
*Deputy Director of the United States Patent and Trademark Office*